United States Patent
Mong et al.

(10) Patent No.: US 6,713,366 B2
(45) Date of Patent: Mar. 30, 2004

(54) METHOD OF THINNING A WAFER UTILIZING A LAMINATED REINFORCING LAYER OVER THE DEVICE SIDE

(75) Inventors: Weng Khoon Mong, Penang (MY); Yew Wee Cheong, Penang (MY); Eng Chiang Gan, Penang (MY); Mun Leong Loke, Penang (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/170,926

(22) Filed: Jun. 12, 2002

(65) Prior Publication Data

US 2003/0235937 A1 Dec. 25, 2003

(51) Int. Cl.$^7$ ............................................. H01L 21/302
(52) U.S. Cl. .................... 438/459; 438/464; 438/977
(58) Field of Search ................... 438/459, 460, 438/464, 690, 691, 692, 959, 977

(56) References Cited

U.S. PATENT DOCUMENTS

| | | | |
|---|---|---|---|
| 4,853,286 A | * 8/1989 | Narimatsu et al. | 428/343 |
| 5,085,009 A | * 2/1992 | Kinumura et al. | 451/291 |
| 5,268,065 A | * 12/1993 | Grupen-Shemansky | 438/118 |
| 5,455,459 A | * 10/1995 | Fillion et al. | 257/760 |
| 6,046,073 A | 4/2000 | Lang et al. | |
| 6,238,515 B1 | 5/2001 | Tsujimoto et al. | |
| 6,245,677 B1 | * 6/2001 | Haq | 438/690 |
| 6,251,705 B1 | 6/2001 | Degani et al. | |
| 6,297,131 B1 | * 10/2001 | Yamada et al. | 438/464 |
| 6,426,275 B1 | * 7/2002 | Arisa | 438/464 |
| 2002/0055238 A1 | * 5/2002 | Sugino et al. | 438/459 |
| 2002/0068453 A1 | * 6/2002 | Grigg et al. | 438/690 |

FOREIGN PATENT DOCUMENTS

| | | | | |
|---|---|---|---|---|
| JP | 1-69013 A | * 3/1989 | | H01L/21/304 |
| JP | 11-87282 A | * 3/1999 | | H01L/21/304 |

OTHER PUBLICATIONS

S. Shiogai et al., "Film for Semiconductor Wafer Device Surface Protection and Semiconductor Wafer Back–Side Sanding Processing Method Using This," Japanese Unexamined Patent Application No. 11–87282 A, published on Mar. 30, 1999.*

Anonymous, "Semiconductor Machinery Division Introduction to the Manufacturing Process . . . Post–Processing," Nov. 27, 2001, 2 pages, Takaktori Corporation, wysiwyg://www.takatorti–g.co.jp/e_products_semicon/index.html.

* cited by examiner

*Primary Examiner*—Carl Whitehead, Jr.
*Assistant Examiner*—Stephen W. Smoot
(74) *Attorney, Agent, or Firm*—Blakely, Sokoloff, Taylor & Zafman LLP

(57) ABSTRACT

A method that includes, obtaining a substrate, placing a reinforcing layer over a first side of the substrate; and thinning the substrate by removing material from an opposite side of the substrate.

27 Claims, 3 Drawing Sheets

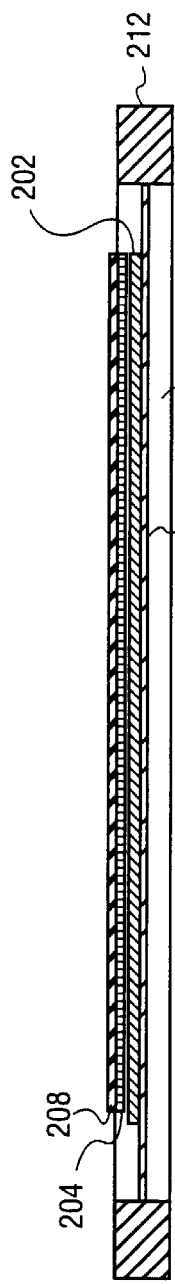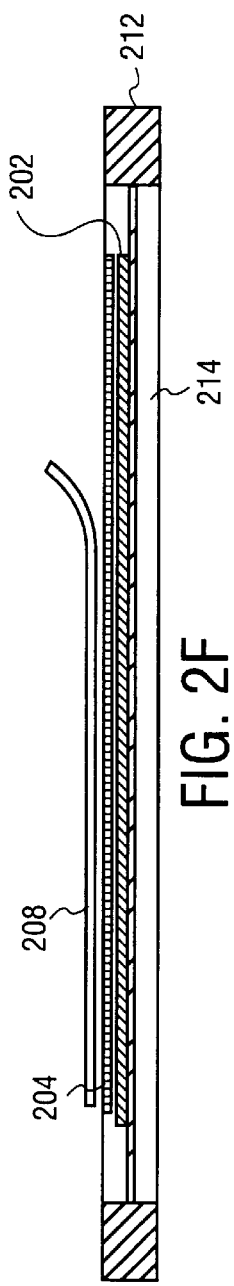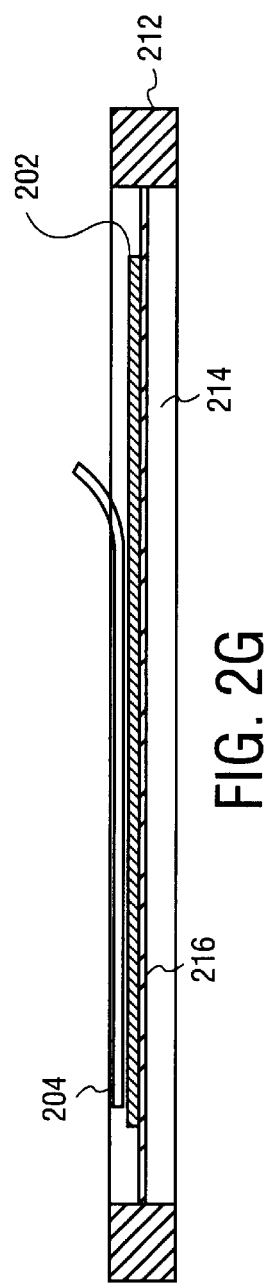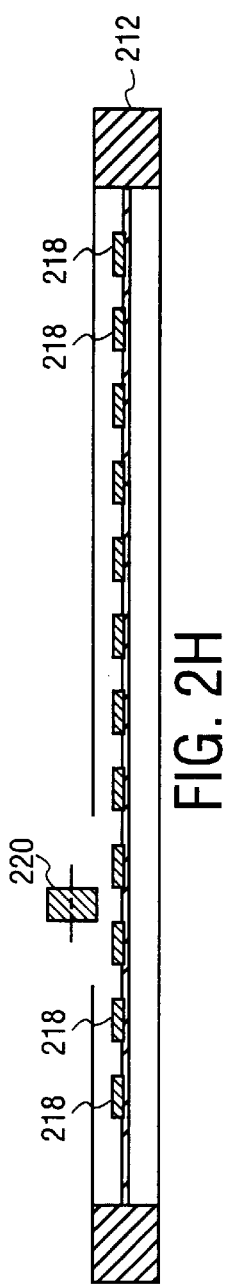

METHOD OF THINNING A WAFER UTILIZING A LAMINATED REINFORCING LAYER OVER THE DEVICE SIDE

FIELD OF THE INVENTION

The present invention pertains in general to microchip processing and in particular to a thin wafer backgrinding operation.

BACKGROUND OF THE INVENTION

The microelectronics industry is consistently achieving an ever shrinking size of devices and ever greater levels of device integration, resulting in higher interconnect densities. A steady succession of interconnect developments and strategies has evolved in the packaging industry to meet the demand of these high interconnect densities. Nearly all have been aimed at one goal, reduced size and with few exceptions, reduced size also translates into lower cost. Thus in state of the art packaging, dual-in-line packages have been largely replaced by surface mount packages, and newer developments, such as chip-on-chip (COC) and multichip modules (MCM), are meeting the high density interconnect demand. These and similar developments are directed toward reducing the package area, i.e. the x-y dimension of the package.

The issue of package thickness has been addressed by techniques for thinning the wafers from which the chips are singulated. The thinning operation is performed on fully processed wafers by mounting the wafer, processed side down, on a temporary carrier such as an adhesive tape and grinding the backside of the wafer. A variety of wafer thinning techniques have been proposed and used, ranging from machines providing simple mechanical abrasion using, e.g., an abrasive grinding wheel, to chemical etching and polishing techniques, and combinations of these, e.g. chemical mechanical polishing (CMP). In a typical wafer thinning process, a 200 mm diameter wafer of completed ICs may be reduced from an initial thickness of 26 to 30 mils to a final thickness of only 12 mils before it is remounted and diced.

The individual IC chips, or dies, are then packaged, which may involve assembly into an MCM or COC tile. The term tile as used herein refers to a sub-assembly of at least two components, a substrate and at least one active chip flip-chip bonded to the substrate. The substrate of the tile may or may not be an active chip. In a common arrangement, the tile comprises two or more components, a substrate, and one or more chips that can be alone, side-by-side, or chip-on-chip, and where the substrate may be active or passive. The chip-on-chip may comprise two stacked chips, or two or more chips stacked on one, usually larger, chip. The term substrate refers in this context to a support element, either active or passive, and the term chip typically refers to a fully processed, i.e. finished, semiconductor IC device. In the preferred case, all of the elements in the tile are semiconductor, typically silicon although the substrate may also be ceramic.

In the assembly operation, the singulated die are handled through a die mounting and bonding tool, and additional interconnections made as needed. To withstand this additional processing without fracture, a die thickness of 10 mils or greater is generally adequate. However, a die thickness of less than 8 mils, which would otherwise be desirable for many applications, is prohibited by the exposure to handling after thinning and by wafer warpage.

Wafer physical warpage is created by stresses that are inherent in the metal layers of the wafer. In addition, tapes that are placed onto the wafer to allow for processing can contribute to wafer warpage. This can be a result of unbalanced tape tension, tape material shrinkage, etc. in which these stresses are transferred to the wafer creating a distortion of the wafer such as bowing.

The limitation on the thickness of the die applies also to a support wafer or substrate. This limitation, 10 mils or greater, is generally accepted in the industry as a norm, and tiles of less than 20 mils have not been attainable. This constraint rules out the use of stacked chips or tiles in several important applications, such as so-called smart cards, i.e. credit cards with imbedded chips.

BRIEF DESCRIPTION OF THE DRAWINGS

The present invention is illustrated by way of example and not limitation in the figures of the accompanying drawings, in which like references indicate similar elements and in which:

FIG. 2E is an illustration of a wafer mounting operation.

FIG. 2F is an illustration of the removal of the stiff reinforcing film.

FIG. 2G is an illustration of the removal of the backgrind tape.

FIG. 2H is an illustration of the operation to separate the individual dies from the wafer using a wafer saw.

DETAILED DESCRIPTION

A method for reducing warpage of a substrate during a substrate thinning process by adding a stiff reinforcing layer is described. In one embodiment, the substrate is a wafer and the reinforcing layer is applied over a protective coating such as a backgrind tape, where the backgrind tape can be placed onto the wafer in preparation for the wafer thinning process. The wafer structural reinforcement can be applied as a thin adhesive backed metal alloy taping material. Alternatively, the reinforcement can be an adhesive backed polymer laminated with reinforcing fibers or the reinforcement can be a flexible polymer film, which can be heat or UV-cured and where the stiffness level can change with the cure.

For purposes of discussing the invention, it is to be understood that various terms are used by those knowledgeable in the art to describe apparatus, techniques, and approaches. In the following description, for purposes of explanation, numerous specific details are set forth in order to provide a thorough understanding of the present invention. It will be evident, however, to one skilled in the art that the present invention may be practiced without these specific details. In some instances, well-known structures and devices are shown in gross form rather than in detail in order to avoid obscuring the present invention. These embodiments are described in sufficient detail to enable those skilled in the art to practice the invention, and it is to be understood that other embodiments may be utilized and that logical, mechanical, electrical, and other changes may be made without departing from the scope of the present invention.

In one embodiment, the reinforcing layer is an aluminum foil tape where the aluminum foil (backing) can be a soft, non-heat treated aluminum with an acrylic adhesive coating on at least one side. The aluminum foil tape can have a total tape thickness of approximately 5 mils where the aluminum backing can be approximately 3 mil (0.003") thick with a tensile strength of approximately 30 lbs./in. width and with an elongation at break of approximately 8%. The aluminum foil tape can perform in a temperature use range of approximately −64°–300° F.

Figure 1:
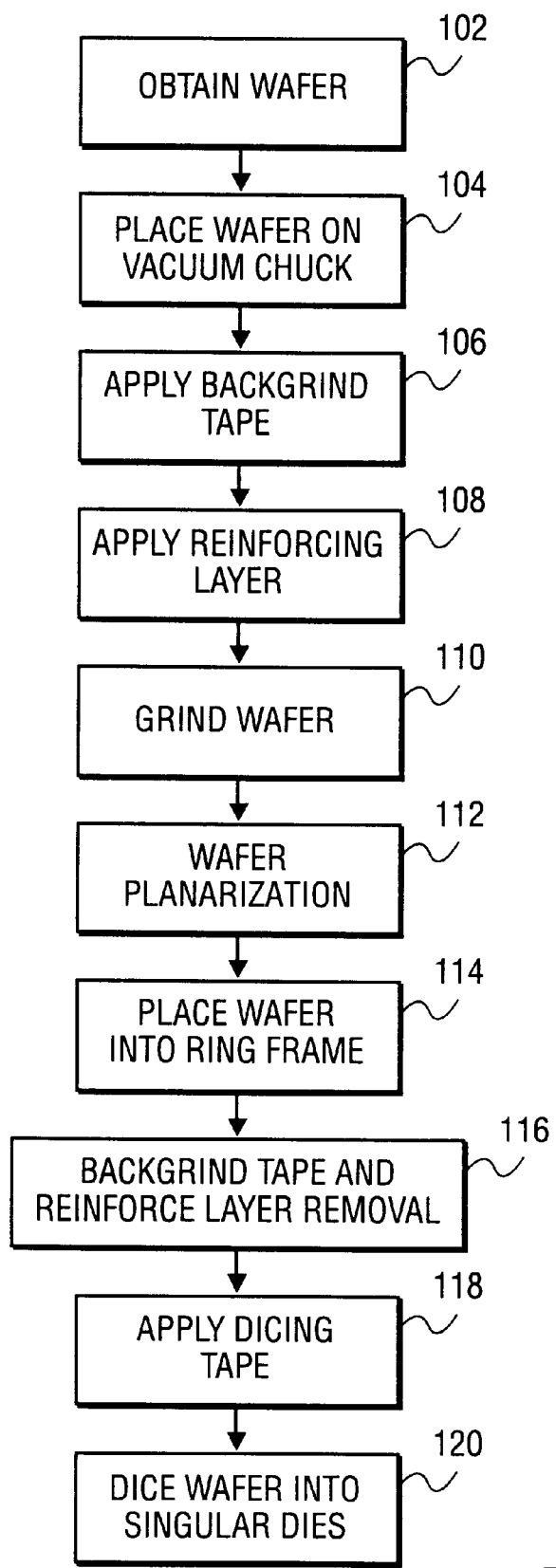
FIG. 1 is a flow-diagram of one embodiment for a method of using a reinforcing layer as a stiffener to support a patterned wafer during a backgrinding operation to thin the wafer.

FIG. 1 is a flow-diagram of one embodiment for a method of using a reinforcing layer as a stiffener to support a patterned wafer during a grinding, i.e. a backgrinding operation to thin the wafer. The patterned wafer is obtained 102 and the device side is placed facing up on a vacuum chuck and where the bottom side contacting the vacuum chuck is the non-device side 104. A protective coating of a pressure sensitive backgrind tape can applied to the wafer device side 106 where the backgrind tape can be a single pre-cut piece that has been die cut from sheet stock. The backgrind tape may be a low-warpage tape such as the ICROS® tape brands manufactured by Mitsui Chemicals America, Inc., located in Purchase, N.Y. The backgrind tape can be placed onto the wafer by a roller or alternatively by a vacuum or through the use of a press, such that minimum stresses are placed into the tape that could contribute to wafer warpage. Next, the reinforcing layer is placed over the backgrind tape 108. The reinforcing layer can be added in strips from a tape or pre-cut from sheet stock to the shape of the wafer and placed onto the wafer as a single circular piece. A backgrinding process can then be performed where the wafer non-device side is ground until the wafer thickness is reduced to a dimension 110. After wafer thinning, a chemical etch can be performed for planarization of the ground surface 112. After wafer planarization, the wafer can be placed into a ring frame where the center can be a nylon fabric 114. Next, tabs placed in the reinforced tape and the backgrind tape can allow for automated tape removal 116. A dicing tape, such as Nitto SPV 224B manufactured by the Nitto Denko Corporation, Osaka, Japan, can next be applied to the wafer non-device side 118 to adhere the wafer to a base structure and after which a wafer saw can dice the individual dies from the wafer 120.

Figure 2A:
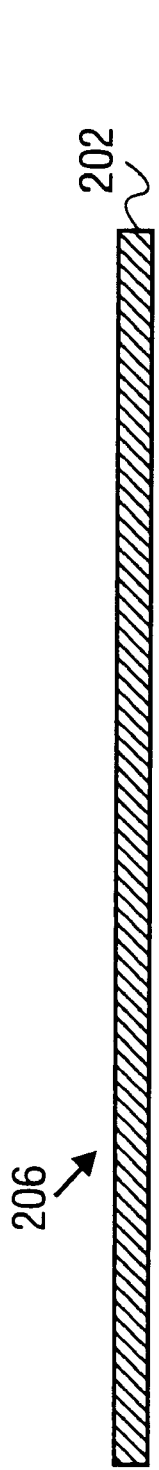
FIG. 2A is an illustration of the wafer with the device side facing up at the start of a process for backgrinding the wafer.

FIGS. 2A–2H are illustrations of one embodiment of a method for using a reinforcing film to provide structural support to a wafer during the wafer thinning process. FIG. 2A is an illustration of the wafer 202 with the device side 206 facing up at the start of a process for backgrinding the wafer 202. The wafer 202 can be placed onto a vacuum base (not shown) that can hold the wafer 202 in a position.

Figure 2B:
FIG. 2B is an illustration of a backgrind tape placed over the device side of the wafer.

FIG. 2B is an illustration of a backgrind tape 204 placed over the device side of the wafer. The wafer 202 can be any diameter such as, for example, 200 mm or 300 mm and the tape 204 can be applied over the wafer 202 to protect the device side 206 during the later backgrind operation to reduce or thin the wafer thickness. The backgrind tape 204 can be pre-cut to the approximate wafer diameter and placed onto the wafer 202 as a single piece film. The backgrind tape 204 can be placed onto the wafer 202 without stretching to minimize stresses from being placed into the tape 204 that can transfer to the wafer 202. Reducing induced stresses in the tape 204 as applied can be accomplished in a variety of ways, such as, for example, by contacting the tape 204 to the wafer 202 at a wafer edge and using a roller (not shown) to lay the film 204 down onto the wafer 202 in a linear fashion as the roller travels across the wafer 202.

Figure 2C:
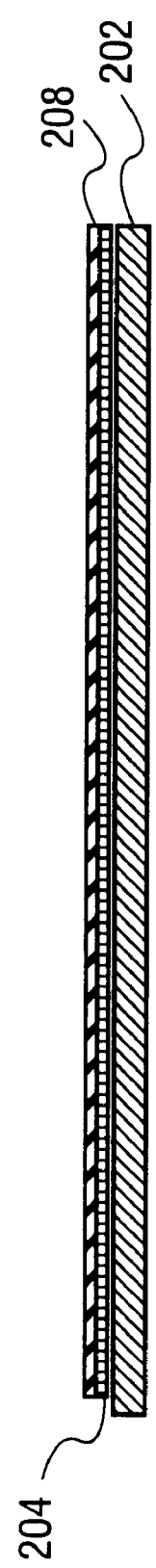
FIG. 2C is an illustration of a reinforcing layer placed onto the backgrind tape.

FIG. 2C is an illustration of a reinforcing layer 208 placed onto the backgrind tape 204. The reinforcing layer 208, such as, for example, an aluminum foil backing with adhesive, can be pre-cut to a shape to approximately cover the previously applied backgrind tape 204. The reinforcing layer 208 can be applied by any mechanical means (again such as by roller) that places only minimal distortion forces into the wafer 202, i.e. maintains the wafer 202 as flat after placement of the reinforcing layer 208.

Figure 2D:
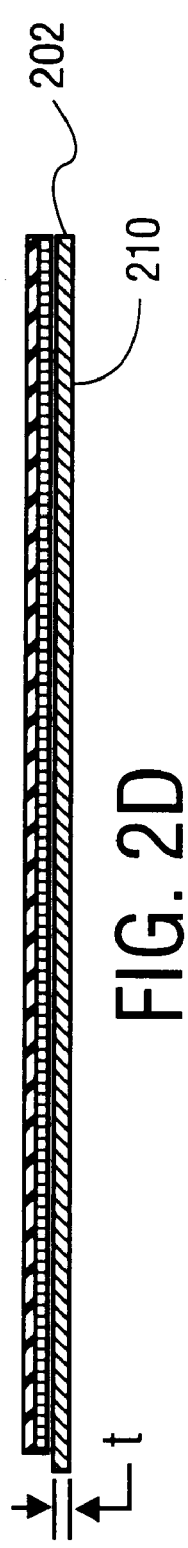
FIG. 2D is an illustration of the wafer thinning operation.

FIG. 2D is an illustration of the wafer thinning operation. Wafer thinning can be accomplished by a mechanical abrasion process where the wafer non-device side 210 can be ground down and after such grinding, a chemical etch process can further polish the ground surface 210. Alternatively, the wafer thinning can be accomplished by a chemical etch, a dry plasma etch, or a Chemical Mechanical Polish (CMP) process. Dry etch processing systems remove material from the surface of a silicon wafer, or from films deposited on the wafer, through exposure to plasma, a highly reactive chemical species created in an etch reactor. The reactor not only produces the plasma but also controls the chemical and physical reactions that occur on the wafer surface at the atomic level. Through the etch process, selected materials are removed from the wafer or film, which shapes the profile and critical dimensions of the remaining materials. CMP can use a wet formula comprising chemicals that attack the material to be removed. This wet formula can be a slurry that also contains abrasive compounds that can act to mechanically remove material. During the wafer thinning operation, the wafer 202 should remain flat while contacting the abrading medium (not shown) such that after the grinding operation, the wafer thickness t remains uniform. After wafer thinning, the wafer 202 and reinforcing layer 208 can be rinsed.

FIG. 2E is an illustration of a wafer mounting operation. After the wafer thinning operation, a ring mount 212 can be obtained that has a wire mesh center 214. The wire mesh center 214 can have a pressure sensitive adhesive (not shown) applied to contact the wafer non-device side 216 previously ground. The wafer 202 can be positioned to contact the center of the wire mesh 214 and become affixed.

FIG. 2F is an illustration of the wafer during reinforcing film removal. Reinforcing film removal occurs after the wafer 202 has been mounted within the ring mount 212. A tab (not shown) can be added to the shape of the reinforcing film 208 such that the reinforcing film 208 removal process can be automated. A machine (not shown) for automatically removing the reinforcing film 208 can be used such as an ATRM-2100, ATRM-2200, or ATRM4000 de-taper manufactured by the Takatori Corporation located in Kashihara City, Japan.

FIG. 2G is an illustration of the removal of the backgrind tape. Again, a tab (not shown) can be placed in the backgrind tape 204 or a tap secondarily attached to the backgrind tape 204 such that the de-taper machine can be used for automatically removing the backgrind tape 204.

FIG. 2H is an illustration of the operation to singulate or separate the individual die 218 from the wafer 202 using a wafer cutting tool 220. The wafer 202 can be sectioned using an automated process that employs the wafer cutting tool 220 such as, for example, a circular rotating diamond blade 220. After the wafer dies are separated, the individual die 218 can be run through an automated washing machine to clean (not shown).

In another embodiment of the reinforcing layer used as a stiffener for a patterned wafer, biaxial oriented fibers can be placed within a resin. The fibers can have a tensile strength to provide stiffness to the reinforcing layer, such as, for example, fiberglass and the biaxial direction can place the fibers at an angle relative to each other and where, in one embodiment, the angle is approximately 90 degrees. The fibers may be placed such that fibers in one direction are stacked over the fibers in the other direction or, alternatively, the fibers in the two directions may be woven into each other. The fibers can be held with resin that is a polymer binder and where the binder can have no adhesive applied, or an adhesive such as a pressure sensitive adhesive can be applied to at least one side. If no adhesive is placed onto the reinforcing layer, the backgrind coating can be a double back tape, i.e. having adhesive on both sides, such that the reinforcing layer can be attached to the backgrind coating by this backgrind adhesive. The reinforcing film can be cut in a single piece to fit onto the wafer with a stamping operation such as a metal cutter formed in the shape of the reinforcing film to fit onto the wafer. Alternatively, the reinforcing film can be applied from a roll of tape, where, in one embodiment, the two fiber orientations relative to the direction of the tape can be in a +45°,−45° fiber direction. However, other embodiments can vary the orientation such as, for example, to have one fiber orientation in the direction of the tape length and the other fiber orientation in the direction with the width of the tape. The weight of the fiberglass fabric can be in the range of approximately 2–10 oz/yrd2.

In yet another embodiment for the reinforcing layer used as a stiffener for a patterned wafer, a thermoset polymer is used. The thermoset polymer may or may not have reinforcing fibers and can be applied as an uncured or partially cured polymer and where further cross-linking is accomplished after the polymer has been applied to the wafer. After full cross-linking, i.e. cure, the stiffness of the plastic film can be increased as a result of the cross-linking and where the cross-linking can be accomplished such as, by example, through exposure to UV or to heat. The thermoset polymer can be a material such as epoxy, urethane, phenolic, or blends of thermoset and thermoplastic materials. The requirement for the thermoset or thermoset blended material can be that the material stiffness should increase after cure to improve wafer anti-warpage properties.

The application of the thermoset polymer can be accomplished in a variety of ways, such as, for example, spray-on of an uncured thermoset or the placing onto the wafer of a partially-cured film, either of which would require a subsequent cure. The application of any of the reinforcing layer materials should not create stresses within the reinforcing layer that are high enough to overcome the reinforcing layer stiffness that would translate into wafer distortion.

Thus a method for reinforcing a substrate to improve anti-warping properties, and in particular, to reinforcing a wafer to maintain wafer flatness during wafer thinning processes has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method, comprising:
   obtaining a substrate;
   placing a protective coating over a first side of the substrate;
   placing a reinforcing layer over the protective coating;
   thinning the substrate by removing material from an opposite side of the substrate;
   removing the reinforcing layer and the protective coating after thinning the substrate; and
   dicing the substrate after removing the reinforcing layer.

2. The method of claim 1, further comprising, etching to polish the opposite side of the substrate.

3. The method of claim 1, further comprising, performing a planarization process on the opposite side of the substrate.

4. The method of claim 1, further comprising placing the substrate onto a mount such that the substrate opposite side contacts the mount, before removing the reinforcing layer.

5. The method of claim 1, wherein the substrate is a wafer and the first side is a device side of the wafer.

6. The method of claim 5, further comprising dicing the wafer to produce individual die.

7. The method of claim 1, wherein the protective coating is added as a single piece.

8. The method of claim 1, wherein the protective coating is added as strips of a tape to produce a single layer.

9. The method of claim 1, wherein the reinforcing layer is added as a single piece.

10. The method of claim 1, wherein the reinforcing layer is added as strips of a tape to produce a single layer.

11. The method of claim 1, further comprising curing the reinforcing layer that is a thermoset polymer film.

12. The method of claim 11, wherein the thermoset polymer is an epoxy.

13. The method of 12, wherein the epoxy is UV cured.

14. The method of claim 12, wherein the epoxy is cured with heat.

15. The method of claim 11, wherein the thermoset polymer is a urethane.

16. The method of claim 11, wherein the reinforcing layer is a blend of two or more different polymers that includes a thermoset polymer.

17. The method of claim 11, wherein the polymer film has a stiffness that increases with cure.

18. The method of claim 17, wherein the polymer film is applied as a spray.

19. The method of claim 17, wherein the polymer film is applied as a partially cured film.

20. The method of claim 1, wherein the reinforcing layer is a fiber reinforced polymer film.

21. The method of claim 20, wherein the fiber is fiberglass.

22. The method of claim 1, wherein the reinforcing layer is a metal foil having an adhesive coating on at least one side.

23. The method of claim 22, wherein the metal is aluminum.

24. The method of claim 1, wherein the reinforcing layer has a tab for removal of the reinforcing layer.

25. A method comprising:
   placing a protective coating onto a device side of a wafer;
   placing a reinforcing layer over the protective coating;
   removing material from a non-device side of the wafer;
   removing the reinforcing layer,
   removing the protective coating;
   rinsing the wafer;
   mounting the wafer onto dicing tape; and
   dicing the wafer into individual dies after removing the reinforcing layer.

26. The method of claim 25, further comprising, planarizing the non-device side of the wafer after removing the material.

27. The method of claim 25, further comprising, forming the reinforcing layer into a shape prior to placing over the protective coating.

* * * * *